US009496321B2

(12) United States Patent
Yang et al.

(10) Patent No.: US 9,496,321 B2
(45) Date of Patent: Nov. 15, 2016

(54) ORGANIC LIGHT EMITTING DISPLAY AND METHOD OF MANUFACTURING THE SAME

(75) Inventors: Taehoon Yang, Yongin-si (KR); Kiyong Lee, Yongin-si (KR); Jinwook Seo, Yongin-si (KR); Taewook Kang, Yongin-si (KR); Byoungkeon Park, Yongin-si (KR); Seihwan Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 841 days.

(21) Appl. No.: 11/961,187

(22) Filed: Dec. 20, 2007

(65) Prior Publication Data

US 2008/0157082 A1 Jul. 3, 2008

(30) Foreign Application Priority Data

Dec. 29, 2006 (KR) ........................ 10-2006-0138320

(51) Int. Cl.

*H01L 29/04* (2006.01)
*H01L 27/28* (2006.01)
*H01L 27/32* (2006.01)
*H01L 27/12* (2006.01)

(52) U.S. Cl.

CPC ....... *H01L 27/3244* (2013.01); *H01L 27/1214* (2013.01)

(58) Field of Classification Search

CPC ........... H01L 27/1214; H01L 27/3244; H01L 23/544
USPC ....... 257/66, 72, 83, E33.064, 797, E23.179, 257/44, 40; 313/498, 499, 500, 505; 349/42, 43
See application file for complete search history.

(56) References Cited

U.S. PATENT DOCUMENTS 5,710,050 A 1/1998 Makita et al.
5,821,562 A 10/1998 Makita et al.
6,204,895 B1 * 3/2001 Nakamura et al. ............... 349/5
7,391,055 B1 * 6/2008 Murakami et al. ............. 257/72

(Continued)

FOREIGN PATENT DOCUMENTS

JP 11-168220 6/1999
JP 2003-332349 11/2003

(Continued)

OTHER PUBLICATIONS

Korean Patent Abstracts, Publication No. 1020060086807, Published Aug. 1, 2006.

(Continued)

*Primary Examiner* — A. Sefer
*Assistant Examiner* — Benjamin Tzu-Hung Liu
(74) *Attorney, Agent, or Firm* — H.C. Park & Associates, PLC

(57) ABSTRACT

An organic light emitting display and a method of manufacturing the same that reduces the number of the masks needed and improves production yield by forming alignment marks during an SGS crystallization process for producing a thin film transistor. The organic light emitting display includes a substrate having a display region and a non-display region, at least one pixel region formed of a thin film transistor and an organic light emitting element electrically coupled to each other in the display region of the substrate, and at least one alignment mark formed in a non-display region of the substrate by the SGS crystallization process.

27 Claims, 8 Drawing Sheets

(56) References Cited

U.S. PATENT DOCUMENTS

| | | | | |
|---|---|---|---|---|
| 7,518,252 | B2 * | 4/2009 | Hiramatsu et al. | 257/797 |
| 7,528,937 | B1 * | 5/2009 | Crespin et al. | 355/75 |
| 7,714,387 | B2 * | 5/2010 | Shiota et al. | 257/352 |
| 2001/0040645 | A1 | 11/2001 | Yamazaki | |
| 2004/0222187 | A1 | 11/2004 | Lin | |
| 2005/0161742 | A1 * | 7/2005 | Isobe et al. | 257/347 |
| 2005/0230684 | A1 * | 10/2005 | Seo et al. | 257/72 |
| 2006/0227281 | A1 * | 10/2006 | Kang et al. | 349/158 |
| 2006/0263956 | A1 * | 11/2006 | Yang et al. | 438/151 |

FOREIGN PATENT DOCUMENTS

| | | |
|---|---|---|
| JP | 2005-326815 | 11/2005 |
| JP | 2006-19689 | 1/2006 |
| JP | 2006-54223 | 2/2006 |
| JP | 2006-332314 | 12/2006 |
| KR | 2001-15479 | 2/2001 |
| KR | 2006-1711 | 1/2006 |
| KR | 2006-50318 | 5/2006 |
| KR | 10-0607665 | 7/2006 |

OTHER PUBLICATIONS

US Office Action issued May 27, 2010, in corresponding U.S. Appl. No. 11/961,213.

U.S. Appl. No. 11/961,213, filed Dec. 20, 2007, Taehoon Yang et al., Samsung SDI.

* cited by examiner

ORGANIC LIGHT EMITTING DISPLAY AND METHOD OF MANUFACTURING THE SAME

CROSS-REFERENCE TO RELATED APPLICATIONS

This application claims the benefit of Korean Patent Application No. 2006-138320, filed Dec. 29, 2006, in the Korean Intellectual Property Office, the disclosure of which is incorporated herein by reference.

BACKGROUND OF THE INVENTION

1. Field of the Invention

Aspects of the present invention relate to an organic light emitting display and a method of manufacturing the same, and more particularly, to an organic light emitting display and a method of manufacturing the same that can reduce the number of the masks needed and improve production yield by forming alignment marks during an SGS crystallization process for producing a thin film transistor.

2. Description of the Related Art

Generally, an organic light emitting element is a self-emissive display device which emits light by electrically excited fluorescent and/or phosphorescent materials when holes are injected into an anode and electrons are injected into a cathode.

FIG. 1 is a cross-sectional diagram illustrating a conventional organic light emitting element. Referring to FIG. 1, an organic light emitting element includes an anode (ITO; Indium Tin Oxide), an organic thin film (or organic light emitting film), and a cathode (Metal). The organic thin film has a multi-layered structure including an emitting layer (EML) to emit light when an electron (−) and a hole (+) are combined to form an exciton, an electron transport layer (ETL) to transport electrons (−) and a hole transport layer (HTL) to transport holes (+). Further, an electron injecting layer (EIL) to inject electrons (−) can be formed on one side of the electron transport layer (ETL), and a hole injecting layer (HIL) to inject holes (+) can be formed on one side of the hole transport layer (HTL).

A driving technique of the organic light emitting element includes a passive matrix (PM) technique and an active matrix (AM) technique. The passive matrix technique is driven by forming anodes and cathodes to be orthogonal to each other and selecting lines connected to the anodes and the cathodes. The passive matrix driving type organic light emitting element is advantageous because of a relatively simple manufacturing process and inexpensive coat but consumes a large amount of power when implementing a large sized display. The active matrix technique includes an active element such as a thin film transistor (TFT) and a capacitive element on each pixel. The active matrix driving type is advantageous because of low power consumption, high image quality, long life, and large sized displays.

Generally, a method of manufacturing an organic light emitting device includes forming a thin film transistor and forming an organic light emitting element. Of course, the method may include an encapsulating process, a module process, and other processes. Explanation of such processes, however, will be omitted.

The manufacturing method of the thin film transistor includes cleaning a substrate, forming a buffer layer, depositing an amorphous silicon, crystallizing to form a polycrystalline silicon, patterning, forming a gate insulating layer, patterning a gate, ion implantation/activation, forming an interlayer insulating layer, forming a contact, patterning source/drain, forming a insulating layer and a via, forming ITOs, and forming a pixel definition film.

Generally, each process of the manufacturing method of the thin film transistor is performed using a separate mask as an alignment mark on a surface of the substrate, a surface of the buffer layer, or a surface of the insulating layer so that it is carried out at the correct positions of the substrate. Particularly, the crystallization to form the thin film transistors needs an alignment mark for position control in order to improve the properties of the resultant thin film transistors. Accordingly, the manufacturing method of the thin film transistor further includes forming the alignment mark.

In addition, the manufacturing method of the organic light emitting display includes a cleaning process, a pre-treating process, a deposition process of the organic light emitting element, and a deposition process of a cathode, etc. A separate operation of forming the alignment mark for position control is generally carried out in each of the separate operations. In other words, a separate operation of forming the alignment mark also is generally carried out in each operation of the manufacturing of the organic light emitting element.

As described above, since a separate process of forming the alignment mark is carried out in the conventional process of manufacturing the organic light emitting display, an additional mask is required. Accordingly, the manufacturing process is more complicated. In addition, if the alignment mark deviates from the correct position beyond a permissible level, inferior goods are produced in subsequent processes, and thus, production yield is reduced substantially.

SUMMARY OF THE INVENTION

Accordingly, an aspect of the present invention is to provide an organic light emitting display and a method of manufacturing the same that can reduce the number of the masks needed and improve production yield by forming alignment marks during the SGS crystallization process for producing a thin film transistor.

Additional aspects and/or advantages of the invention will be set forth in part in the description which follows and, in part, will be obvious from the description, or may be learned by practice of the invention.

According to an aspect of the present invention, there is provided an organic light emitting display, which includes: a substrate having a display region and a non-display region; at least one pixel region that is formed in the display region and includes a thin film transistor and an organic light emitting element electrically coupled to each other; and at least one alignment mark formed in a non-display region of the substrate by a SGS crystallization process.

The alignment mark may be a polycrystalline silicon formed by the SGS crystallization process. There may be no grain boundary or at least one grain boundary in the polycrystalline silicon. The thin film transistor of the pixel region may be the polycrystalline silicon by the SGS crystallization process. The thin film transistor and the alignment mark may be formed on a same plane.

The alignment mark may have a shape selected from the group consisting of a triangle, a rectangle, a rhombus, a pentagon, a cross, and a "⊣" shape, or combinations thereof. The alignment mark may have a cross-sectional area in the range of 100-900 $\mu m^2$. The alignment mark may have a width in the range of 1-20 μm.

The catalyst metal from the SGS crystallization process may remain in the alignment mark. The catalyst metal remaining in the alignment mark may have a concentration in the range of $1.0\times10^{16}-1.0\times10^{20}$ atoms/$cm^3$.

The substrate may be made of any one selected from glass, plastic, stainless steel and nano-composite materials.

The non-display region may be further provided with at least one of a data driver to supply a data signal to the display region, a scan driver to supply a scan signal, and a light emitting control driver to supply a light emitting control signal.

According to another aspect to the present invention, there is provided an organic light emitting display, which includes: a substrate having a display region and a non-display region; a buffer layer formed on the display region and the non-display region; a semiconductor layer formed on the buffer layer corresponding to the display region by an SGS crystallization process; an alignment mark formed on the buffer layer corresponding to the non-display region by the SGS crystallization process; a gate insulating layer formed on the semiconductor layer and the alignment mark; a gate electrode formed on the gate insulating layer that corresponds to the semiconductor layer; an interlayer insulating layer formed on the gate electrode; a source/drain electrode formed on the interlayer insulating layer and simultaneously electrically coupled to the semiconductor layer; an insulating layer formed on the source/drain electrode; and an organic light emitting element formed on the insulating layer and simultaneously electrically coupled to the source/drain electrode.

The semiconductor layer and alignment mark may be polycrystalline silicon formed by the SGS crystallization process. There may be no grain boundary or at least one grain boundary in the polycrystalline silicon.

An interlayer insulating layer may be additionally formed on the gate insulating layer that corresponds to the alignment mark. An insulating layer may be additionally formed on the interlayer film that corresponds to the alignment mark. The insulating layer may include a protective film and a planarization film and be formed on the region that corresponds to the alignment mark. According to another aspect of the present invention, there is provided a method of manufacturing an organic light emitting display, which includes: providing a substrate having a display region and a non-display region; forming a buffer layer on the display region and the non-display region; depositing an amorphous silicon layer on the buffer layer; forming a capping layer on the amorphous silicon layer; positioning catalyst metal on the capping layer corresponding to both of the display region and the non-display region, and heating them, so that the catalyst metal is diffused to the amorphous silicon so as to become seeds, and the amorphous silicon grows from the seeds to polycrystalline silicon, and a semiconductor layer is formed in the display region by the polycrystalline silicon, and an alignment mark is formed in the non-display region by the polycrystalline silicon; forming at least one transistor by using the semiconductor layer in the display region; and forming an organic light emitting element electrically coupled to the transistor in the display region.

The forming of the capping layer may include: forming a diffusion barrier film having at least one opening for position control in each of the display region and the non-display region; and forming a diffusible film covering both of the opening for position control and the diffusion barrier film.

In the forming of the diffusion barrier film, the opening for position control may have an area in the range of 100-900 $\mu m^2$.

The catalyst metal may be selected from the group comprising Ni, Pd, Ti, Ag, Au, Al, Sn, Sb, Cu, Co, Mo, Tr, Ru, Rh, Cd, Pt, and combinations thereof.

In the forming of the semiconductor layer and the alignment mark, the heating may be carried out in a temperature range of 400-700° C.

The method may further include removing the amorphous silicon after forming the semiconductor layer and the alignment mark. In the forming of the semiconductor layer and the alignment mark, the catalyst metal produced from the SGS crystallization process may remain in the alignment mark.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
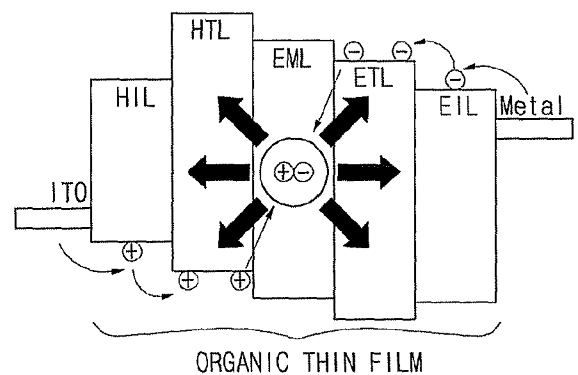
FIG. 1 is a cross-sectional diagram illustrating a conventional organic light emitting element.

Reference will now be made in detail to the present embodiments of the present invention, examples of which are illustrated in the accompanying drawings, wherein like reference numerals refer to the like elements throughout. The embodiments are described below in order to explain the present invention by referring to the figures. In addition, an electrical connection between two portions or two features that are "electrically coupled" include direct connection between the two portions as well as electrical connection between the two portions or features between which a third element or multiple elements may be disposed. Further, when it is mentioned that a layer or an electrode is said to be "disposed on" or "formed on" another layer or a substrate, the phrase indicates that the layer or electrode may be directly formed on the other layer or substrate, or that a third layer or multiple layers may be disposed therebetween. In addition, the thickness of layers and regions and the size and proportions of features may be exaggerated for clarity.

Figure 2:
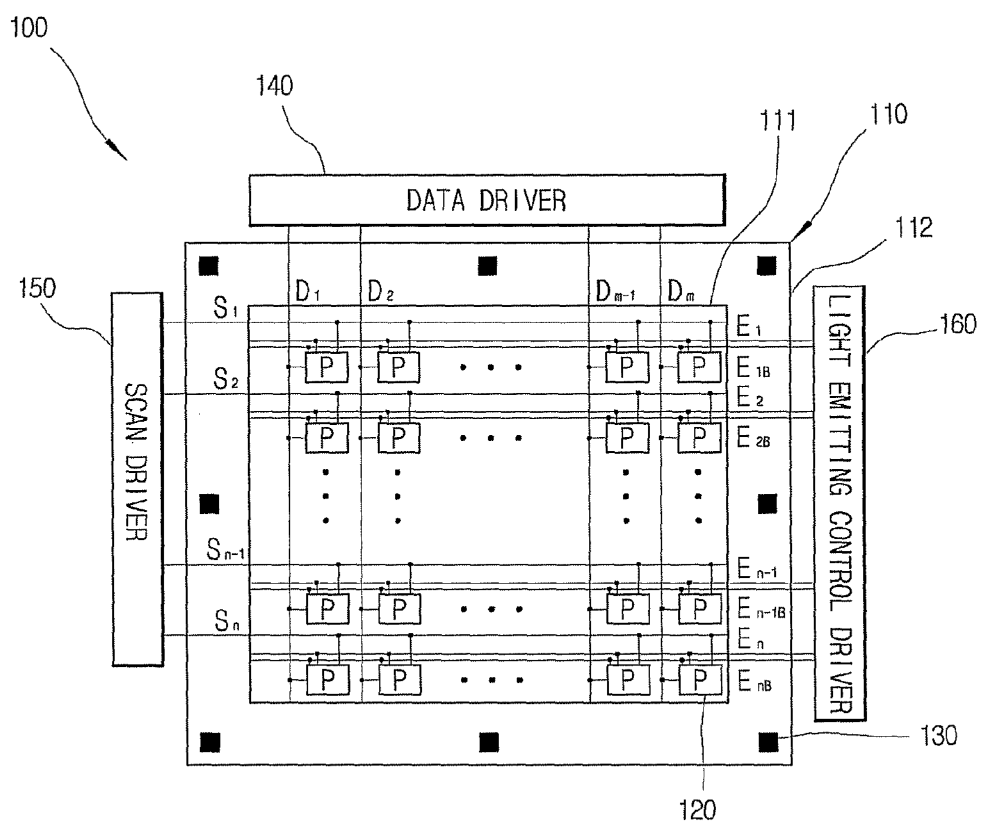
FIG. 2 is a schematic diagram illustrating an organic light emitting display with alignment marks according to an aspect of the present invention.

FIG. 2 is a schematic diagram illustrating an organic light emitting display with an alignment mark according to aspects of the present invention. Referring to FIG. 2, an organic light emitting display (OLED) 100 includes a substrate 110 having a display region 111 and a non-display region 112, at least one pixel region 120 formed on the display region of a substrate 110, at least one alignment mark 130 formed on the non-display region 112 of the substrate 110 by a super grained silicon (SGS) crystallization process. Herein, the pixel region 120 and the alignment marks 130 are illustrated in large scale so that features according to aspects of the present invention can be easily understood.

A data driver 140, a scan driver 150, and a light emitting control driver 160 may be electrically coupled to the substrate 110. Alternatively, the data driver 140, the scan driver 150 and the light emitting control driver 160 may be formed directly on the substrate 110. In addition, the substrate 110 can be an organic light emitting display panel.

Generally, the substrate 110 can be divided into a central rectangular display region 111, and a peripheral rectangular non-display region 112 formed in a rectangular stripe shape about the display region 111. However, the substrate 110 is not limited thereto such that the display region 111 and the non-display region 112 may be formed in any shape, and the non-display region 112 need not be disposed about the periphery of the display region 111. In the display region 111, a plurality of data lines (D1-Dm) may be formed in a first direction and a plurality of scan lines (S1-Sn) and a plurality of light emitting control lines (E1-En) may be formed in a second direction. The first direction may be a vertical direction with reference to an image to be displayed on the OLED 100, and the second direction may be transverse to the first direction such that the second direction crosses the first direction. As such, the second direction may be horizontal with respect to the image to be displayed on the OLED 100.

The pixel regions 120 may be formed at regions in which the data lines (D1-Dm), the scan lines (S1-Sn), and the light emitting control lines (E1-En) intersect in the display region 111. Such pixel regions 120 may be formed by a transistor and an organic light emitting element.

At least one alignment mark 130 may be formed in the non-display region 112 of the substrate 110. As described below, the alignment mark 130 is used as a reference for position control in various processes of crystallizing an amorphous silicon layer, forming a gate electrode, forming source/drain electrode, etc., so that high quality transistors can be obtained. The alignment mark may also be used for position control during the manufacturing process of organic light emitting element in the display region 111. The alignment mark 130 may be polycrystalline silicon formed by an SGS crystallization process, but not limited thereto. The alignment mark 130 may also be made of any materials that can be formed by an SGS crystallization process. In addition, the alignment mark 130 can be symmetric or asymmetric in any direction and formed by a number, but is not limited thereto.

FIGS. 3*a*-3*f* are enlarged diagrams illustrating various, non-limiting shapes of alignment marks 130 as shown in FIG. 2. Referring to FIGS. 3*a*-3*f*, the alignment marks 130 generally have a shape selected from a triangle (130_*a*)(FIG. 3*a*), a rectangle (130_*b*)(FIG. 3*b*), a rhombus (130_*c*)(FIG. 3*c*), a pentagon (130_*d*)(FIG. 3*d*), a cross (130_*e*)(FIG. 3*e*), a "T" arranged in any orientation (130_*f*)(FIG. 3*f*), and equivalents and combinations thereof. However, the shape of the alignment marks 130 is not limited thereto, and may have other shapes.

In addition, it is desirable that the at least one alignment mark 130 has a cross-sectional area in the range of 100-900 $\mu m^2$. As used herein, cross-sectional area of the alignment mark 130 refers the area of the alignment mark 130 with reference to a plane as defined by the substrate 110 or the buffer 120. As described below, the cross-sectional area is the same as that of an opening for position control of the diffusion barrier, which is used to form the alignment mark 130 during the crystallization process. If the cross-sectional area of the opening is below about 100 $\mu m^2$, no crystalline material or crystals will be obtained, and thus the alignment mark 130 may not be formed. If the cross-sectional area of the opening is above about 900 $\mu m^2$, the crystallization region will be much larger than the opening and its shape may be deformed, such that the alignment mark 130 can not be used as an alignment mark.

Figure 3A:
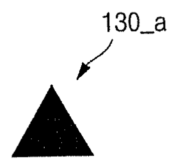
FIGS. 3*a*-3*f* are enlarged diagrams illustrating various shapes of the alignment mark of FIG. 2.
Figure 3B:
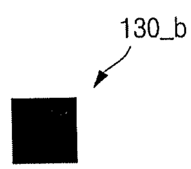
Figure 3C:
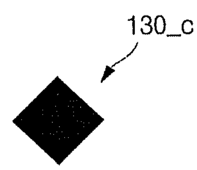
Figure 3D:
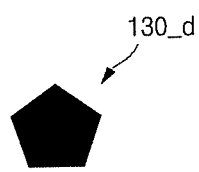
Figure 3E:
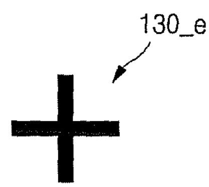
Figure 3F:
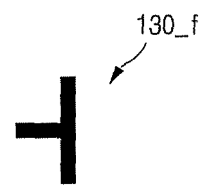

As an example, if the alignment mark 130_*b* is rectangular as shown in the FIG. 3*b*, it is desirable that one side of the opening for position control of the diffusion barrier is about 20 μm or less in length. In practice, considering the size and the concentration of the catalyst metal currently used, experimentally and theoretically, it is most preferable that the cross-sectional area of the alignment mark or the opening for position control is about 400 $\mu m^2$.

Further, the alignment mark 130 can have other shapes than rectangular. Regardless of the shape of the alignment mark 130, however, it is desirable that the width of the alignment mark is about 20 μm or less. Specifically, if the width of the alignment mark is above 20 μm, the shape of the crystallization region that forms the alignment mark 130 may be irregular, and accordingly, the resultant alignment mark 130 may not aid in the alignment of the layers. The alignment mark 130 may have a width in the range of 1-20 μm, provided that it is possible to observe the alignment mark with microscope.

Herein, the SGS crystallization process refers to the method of crystallization including the forming of a capping layer on the amorphous silicon layer to control diffusion or penetration of the catalyst metal, depositing the catalyst metal on the capping layer, and then heating them to crystallize the amorphous silicon into polycrystalline silicon with a relatively large size. By the SGS crystallization process, there may be no grain boundary (most preferable) or at least one grain boundary in the alignment mark 130 and a semiconductor layer (described below). In addition, since the cross-sectional area and width of the alignment mark 130 can be larger than those of the semiconductor layer, the alignment mark 130 can also have at least one grain boundary, but the alignment mark 130 is not limited thereto.

Figure 4:
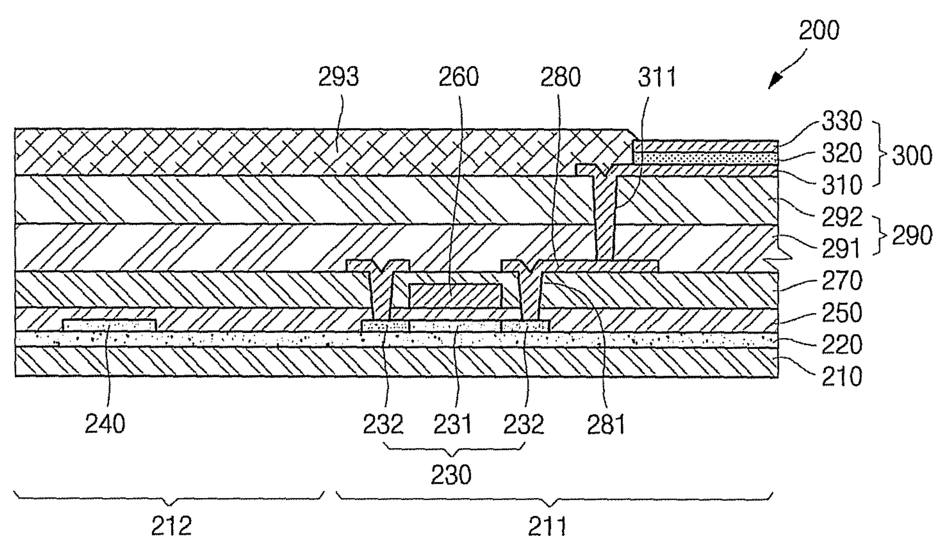
FIG. 4 is a cross-sectional diagram illustrating an example of a pixel circuit in an organic light emitting display.

FIG. 4 is a cross sectional diagram of an organic light emitting display illustrating correlation of an alignment mark and a pixel circuit. Referring to FIG. 4, the organic light emitting display 200 according to aspects of the present invention includes a substrate 210, a buffer layer 220, a semiconductor layer 230, an alignment mark 240, a gate insulating layer 250, a gate electrode 260, an interlayer insulating layer 270, a source/drain electrode 280, an insulating layer 290, and an organic light emitting element 300.

The substrate 210 is generally flat and has a generally flat top side and a generally flat bottom side, and a thickness of the substrate is in the range of about 0.05-1 mm. When the thickness of the substrate 210 is below about 0.05 mm, the substrate is prone to be damaged or fractured. In addition, it is unnecessary for the thickness of the substrate 210 to be above about 1 mm. Additionally, the substrate 210 may be made from any one of typical glass, plastic, stainless steel, nano-composite materials and equivalents thereof, but it is not limited thereto. In the figures, the substrate 210 divided into a display region 211 and a non-display region 212 is shown. As described above, pixel regions including the semiconductor layer 230 or the organic light emitting element 300, etc. are formed in the display region 211 of the substrate 210, and the alignment mark 240 and various drivers are formed in the non-display region 212 of the OLED 200.

The buffer layer 220 can be formed on the top side of the substrate 210 in both of the display region 211 and the non-display region 212. The buffer layer 220 prevents moisture ($H_2O$), hydrogen ($H_2$) or oxygen ($O_2$), etc., from penetrating into the semiconductor layer 230, the alignment mark 240, and/or the organic light emitting element 300 through the substrate 210. As such, the buffer layer 220 is made from any one of silicon oxide ($SiO_2$), silicon nitride ($Si_3N_4$), inorganic materials and equivalents thereof, but the buffer layer 220 is not limited thereto. Alternatively, the buffer layer 220 may need not be formed.

The semiconductor layer 230 is deposited on the buffer layer 220 corresponding to the display region 211 of the substrate 210. The semiconductor layer 230 is separated by a distance from the alignment mark 240. The semiconductor layer 230 comprises a channel region 231 and source/drain regions 232 disposed at the both sides of the channel region 231. This semiconductor layer 230 may consist of polycrystalline silicon formed by an SGS crystallization process or an equivalent process. The semiconductor layer 230 can be used as a thin film transistor. If the thin film transistor is a polycrystalline silicon thin film transistor, the polycrystalline silicon thin film transistor can be formed by a crystallization method using a catalyst metal and a capping layer, i.e., an SGS crystallization process. In this case, there may be no grain boundary or at least one grain boundary in the semiconductor layer 230. Of course, the thin film transistor may be any one of PMOS, NMOS, and equivalents thereof, but the semiconductor layer 230 is not limited thereto.

The alignment mark 240 may be formed on the buffer layer 220 from the same materials as the semiconductor layer 230 corresponding to or disposed in the non-display region 212 of the substrate 210. As such, the alignment mark 240 and the semiconductor layer 230 (i.e., the thin film transistor) are formed on a same plane or the top surface of the buffer layer 220. Also, the semiconductor layer 230 is formed at a predetermined distance and at a predetermined direction from the alignment mark 240 so as to increase the precision with which the semiconductor layer 230, and other layers, may be formed. Further, the alignment mark 240 may be formed of polycrystalline silicon formed by the SGS crystallization process or equivalents thereof, but it is not limited thereto. There may also be no grain boundary or at least one grain boundary in the alignment mark 240. However, there may be two or more grain boundaries depending on the cross-sectional area or width of the alignment mark 240. In addition, it is desirable that the alignment mark 240 has a thickness of the range of 100-1000 Å. If the thickness of the alignment mark 240 is below about 100 Å, it is not easily observable with microscope, given current technology, due to the transparency of the alignment mark 240. Although the thickness of the alignment mark 240 can be above about 1000 Å, it is not necessary.

In addition, although it is not specifically described, the alignment mark 240 can have a shape selected from triangle, rectangle, rhombus, pentagon, cross, "T", equivalents thereof and combinations thereof (see FIGS. 3_a_-3_f_). However, the shape of the alignment mark 240 is not limited thereto and may have other shapes.

Further, it is desirable that the alignment mark 240 has a cross-sectional area in the range of about 100 $\mu m^2$-about 900 $\mu m^2$. As used herein, cross-sectional area of the alignment mark 240 refers the area of the alignment mark 240 with reference to a plane as defined by the substrate 210 or the buffer 220. In practice, as described below, it is difficult to form the alignment mark 240 below 100 $\mu m^2$. On the contrary, if the area of the opening is above 900 $\mu m^2$, the shape of the alignment mark 240 may be irregular, and thus the alignment mark 240 may not be useful to aid in the alignment of the semiconductor layer 230 and other layers. Additionally, experimentally and theoretically, it is shown that a better alignment mark 240 can be formed by an SGS crystallization process when the cross-sectional area of the alignment mark 240 is about 400 $\mu m^2$.

Further, the alignment mark 240 can have other shapes than rectangular. Whatever shapes the alignment mark 240 has, however, it is desirable that the width of the alignment mark 240 is about 20 μm or less. Namely, if the width of the alignment mark 240 is above 20 μm, the shape of the crystallization region for forming alignment mark 240 may be irregular and, accordingly, the resultant alignment mark 240 may not aid in the alignment of the layers. The alignment mark 240 may have a width in the range of 1-20 μm, provided that it is possible to observe the alignment mark 240 with microscope.

The gate insulating layer 250 can be deposited on the top surfaces of the semiconductor layer 230 and the alignment mark 240. The gate insulating layer 250 can be deposited on the semiconductor layer 230 and the buffer layer 220 so as to circumscribe the alignment mark 240. In addition, the gate insulating layer 250 can be formed from any one of a silicon oxide layer, a silicon nitride layer, an inorganic film, and equivalents thereof, but the gate insulating layer 250 is not limited thereto.

The gate electrode 260 can be formed on the top surface of the gate insulating layer 250. Specifically, the gate electrode 260 can be formed on the gate insulating layer 250 corresponding to the channel region 231 of the semiconductor layer 230. Such gate electrode 260 may be formed by applying an electric field to the lower channel region 231 so as to form hole channels and electron channels in the channel region 231. In addition, the gate electrode 260 can be formed from any one of typical metals (Mo, MoW, Ti, Cu, Al, AlNd, Cr, Mo alloy, Cu alloy, Al alloy, etc.), doped polycrystalline silicon, and equivalents thereof but is not limited thereto. Also, the gate electrode 260 can be formed at an optimal position corresponding to the semiconductor layer 230 by forming the gate electrode with reference to the alignment mark 240 as a register.

The interlayer insulating layer 270 can be deposited on the top surface of the gate electrode 260. The interlayer insulating layer 270 can also be deposited on the insulating layer 250 to circumscribe the gate electrode 260. In addition, the interlayer insulating layer 270 can be formed on the gate insulating layer 250 corresponding to the alignment mark 240. Further, the interlayer insulating layer 270 can be formed from any one of a polymer series, a plastic series, a glass series, and equivalents thereof, but the interlayer insulating layer 270 is not limited thereto.

The source/drain electrode 280 can be formed on the top surface of the interlayer insulating layer 270. Electrically conductive contacts 281 can be formed between the source/drain regions 232 and the semiconductor layer 230 through the interlayer insulating layer 270. Specifically, the source/drain electrode 280 and the source/drain regions 232 of the semiconductor layer 230 are electrically coupled by the conductive contact 281. Further, the source/drain electrode 280 can be formed of the same metal as the gate electrode 260, but the source/drain electrode 280 is not limited thereto. In addition, the source/drain electrode 280 can be formed at an optimal position corresponding to the semiconductor layer by forming source/drain electrode 280 with reference to the alignment mark 240.

Meanwhile, the semiconductor layer (i.e., thin film transistor) 230 may have a coplanar structure. Aspects of the present invention, however, are not limited thereto; for example, thin film transistor structures such as an inverted coplanar structure, a staggered structure, an inverted staggered structure, and equivalents thereof can be used. In addition, the source/drain electrode 280 can be formed at an optimal position corresponding to the semiconductor layer 230 by forming the source/drain electrode 280 with reference to the alignment mark 240.

The insulating layer 290 can be formed on the top surface of the source/drain electrode 280. The insulating layer 290 also covers the interlayer insulating layer 270 circumscribing at least a portion of the source/drain electrode 280. In addition, the insulating layer 290 is deposited on the interlayer insulating layer 270 corresponding to the alignment mark 240. The insulating layer 290 may comprise a protective film 291 and a planarization film 292 formed on the top surface of the protective film 291. The protective film 291 covers the source/drain electrode 280 and the interlayer insulating layer 270, thus protecting the source/drain electrode 280 and the gate electrode 260, etc. The protective film 291 can be formed from typical inorganic film or equivalents thereof, but the protective film 291 is not limited thereto. In addition, the planarization film 292 covers the protective film 291. The planarization film 292 flattens the overall surface of the element and can be formed from any one of BCB (benzocyclobutene), acryl, and equivalents thereof, but the planarization film 292 is not limited thereto.

The organic light emitting element 300 can be formed on the top surface of the insulating layer 290. The organic light emitting element 300, in turn, can include an anode 310, an organic light emitting film 320 formed on the anode 310, and a cathode 330 formed on the organic light emitting film 320. The anode 310 can be formed from any one of ITO (Indium Tin Oxide), ITO/Ag, ITO/Ag/IZO (Indium Zinc Oxide), and equivalents thereof but not limited thereto. The ITO is a transparent, electrically conductive film which has uniform work function and has a lower hole injection barrier to the organic light emitting film 320. The Ag forms a film that reflects light transmitted from the organic light emitting film 320 to the top surface in the top-emission type. Meanwhile, the organic light emitting film 320 comprise an emitting layer (EML) to emit light when an electron and a hole are combined to form an exciton, an electron transport layer (ETL) to transport electrons, and a hole transport layer (HTL) to transport holes. Further, an electron injecting layer (EIL) to inject electrons and a hole injecting layer (HIL) to inject holes can be formed on the electron transport layer (ETL). Further, the cathode 330 can be formed from any one of Al, MgAg alloy, MgCa alloy, and equivalents thereof, but the cathode 330 is not limited thereto. Meanwhile, if the top-emission type structure for the OLED 200 is adopted according to aspects of the present invention, the thickness of the cathode 330 should be very thin. The MgAg alloy has a lower electron injection barrier than the Al, and the MgCa alloy has a lower injection barrier than the MgAg alloy. But, as the MgAg alloy and the MgCa alloy are sensitive to the environment and can be oxidized to form an insulating layer, a protective layer may be formed on the MgAg and MgCa alloys to shield the MgAg and the MgCa alloys from the environment. Further, the source/drain electrode 280 and the anode 310 of the organic light emitting element 300 can be electrically connected by conductive contacts 311 formed through the insulating layer 290, or the protective layer 291 and the planarization film 292. Herein, the above-described top-emission type OLED 200 emits light away from the substrate 210, but the OLED 200 is not limited thereto. Aspects of the present invention can also be applied in a bottom-emission type OLED that emits light in an opposite direction, or a top and bottom emission type OLED that emits light in both directions.

Meanwhile, a pixel definition film 293 can be formed on the insulating layer 290 circumscribing the organic light emitting element 300 according to aspects of the present invention. The pixel definition film 293 increases the definiteness of the boundaries of a red organic light emitting element, a green organic light emitting element, and a blue organic light emitting element. In addition, the pixel definition film 293 can be formed from polyimide or equivalents thereof but is not limited thereto. Further, the pixel definition film 293 can be formed on the insulation layer 290 corresponding to the alignment mark 240, but the pixel definition film 293 may be omitted.

Figure 5:
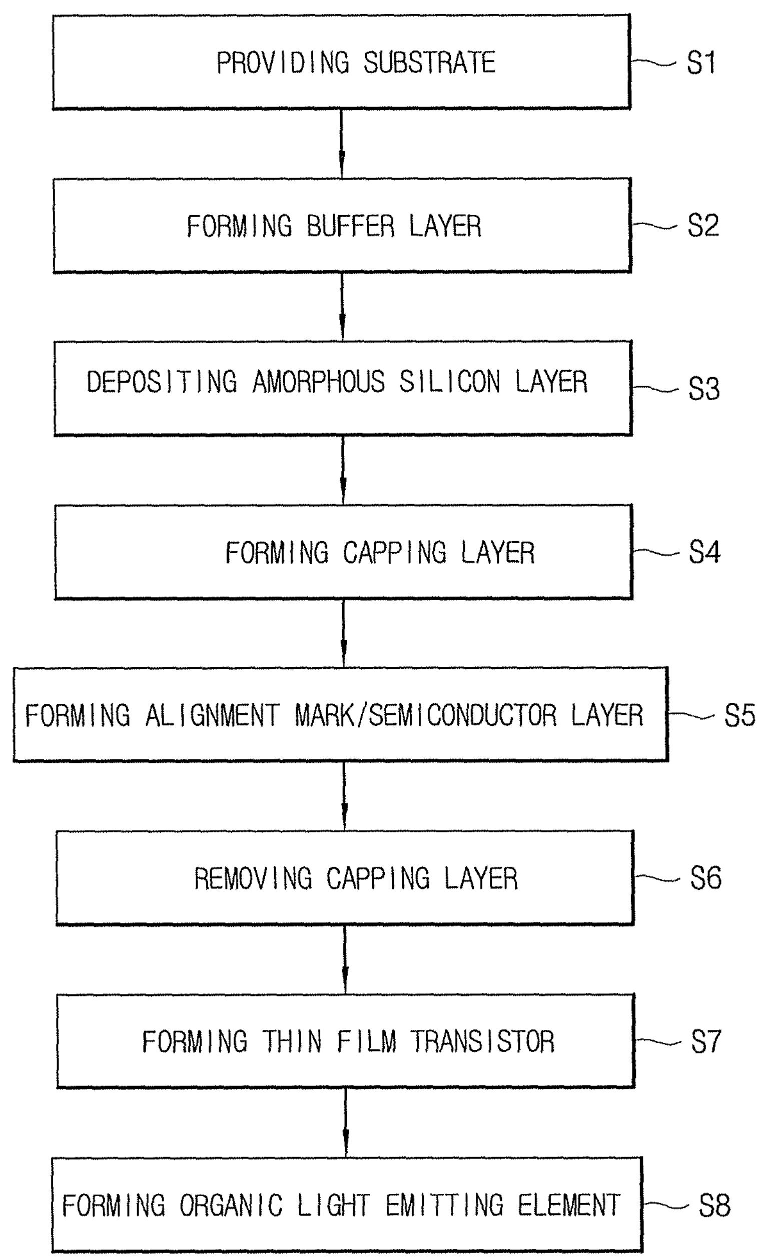
FIG. 5 is a flow chart illustrating a process for manufacturing an organic light emitting display with the alignment marks according to aspects of the present invention.

FIG. 5 is a flow chart illustrating a process for manufacturing an organic light emitting display with an alignment mark according to aspects of the present invention. Referring to FIG. 5, the method for manufacturing the organic light emitting display includes providing a substrate having a display region and a non-display region (S1); forming a buffer layer (S2); depositing an amorphous silicon layer (S3); forming a capping layer (S4); forming an alignment mark/semiconductor layer (S5); removing the capping layer (S6); forming a thin film transistor (S7); and forming an organic light emitting element (S8).

Figure 6A:
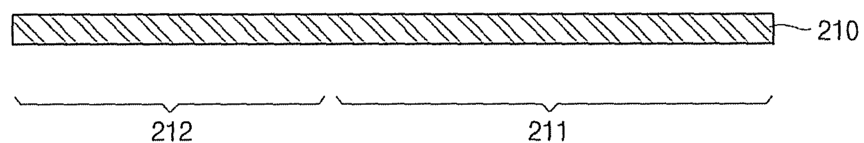
FIGS. 6*a*-6*h* are cross sectional diagrams illustrating the processes of manufacturing an organic light emitting display with the alignment marks according to aspects of the present invention.

FIGS. 6*a*-6*h* are cross sectional diagrams illustrating the processes of manufacturing an organic light emitting display with an alignment mark according to aspects of the present invention. The method for manufacturing the organic light emitting display with the alignment mark will be explained with reference to FIG. 5 and FIGS. 6*a*-6*h*. Referring to FIGS. 5 and 6*a*, a substrate 210, which is generally flat and has a generally flat top surface and a generally flat bottom surface and a thickness, is provided in the operation (S1).

Typically, the substrate 210 is made from any one of glass, plastic, stainless steel, and nano-composite materials but is not limited thereto. In addition, it is desirable that the substrate 210 has a thickness of about 0.05 mm-about 1 mm. When the thickness of the substrate 210 is below about 0.05 mm, the substrate is difficult to handle and is prone to damage or fracture during cleaning, etching, and heat treating. In addition, the thickness of the substrate 210 may be above about 1 mm but such thickness is not needed. The substrate 210 is divided into the display region 211 and the non-display region 212. The display region 211 will include the pixel region having circuits and the organic light emitting element 300, etc., and in the non-display region 212, the alignment mark 240 will be formed.

Figure 6B:
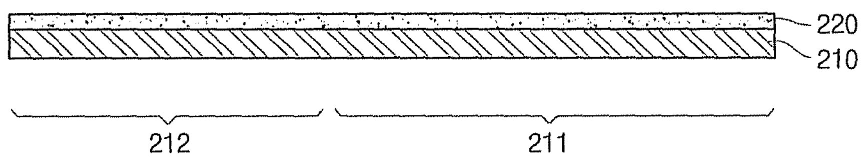

Referring to FIGS. 5 and 6*b*, a buffer layer 220 having a thickness is formed on the top surface of the substrate 210 in the forming of a buffer layer (S2). More specifically, a buffer layer 220 having a constant thickness is deposited on the substrate in both the display region 211 and the non-display region 212 of the substrate 210. The buffer layer 220 may be formed from any one of silicon oxide film, silicon nitride film, inorganic film, and equivalents thereof but is not limited thereto. The buffer layer 220 prevents moisture, hydrogen, or oxygen, etc. from penetrating into the alignment mark 240, the semiconductor layer 230, and/or the organic light emitting element 300 through the substrate 210. The buffer layer 220 facilitates forming of the alignment mark 240, the semiconductor layer 230, and other layers thereon.

Figure 6C:
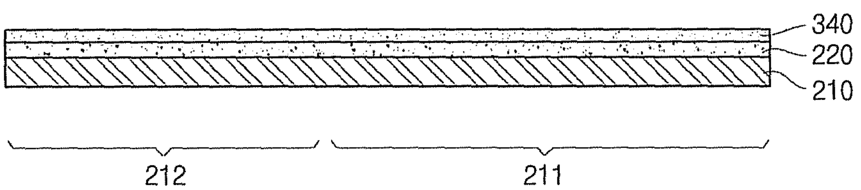

Referring to FIGS. 5 and 6*c*, in the operation (S3), an amorphous silicon layer 340 with a constant thickness is deposited onto the top surface of the buffer layer 220. More specifically, amorphous silicon layer 340 having the constant thickness is deposited on both the display region 211 and the non-display region 212 of the substrate 210. For example, the amorphous silicon layer 340 is formed by PECVD (Plasma Enhanced Chemical Vapor Deposition), LPCVD (Low Pressure Chemical Vapor Deposition), sputtering, or equivalents thereof but not limited thereto. In addition, it is desirable that the amorphous silicon layer 340 deposited on the buffer layer 220 in the non-display region 212 has a thickness of the range of 100-1000 Å. If the thickness of the amorphous silicon layer 340 is below about 100 Å, it is not observed with microscope due to its transparency after crystallization. Although the thickness of the amorphous silicon layer 340 can be above about 1000 Å, it is not necessary.

Figure 6D:
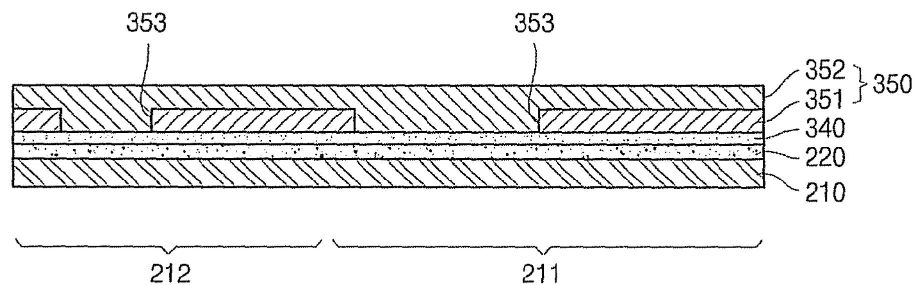

Referring to FIGS. 5 and 6*d*, in the operation (S4), a capping layer 350 including a diffusion barrier film 351 and a diffusible film 352 is formed on the surface of the amorphous silicon layer 340. More specifically, the diffusion barrier film 351 having openings for position control 353 are formed on the buffer layer 220 corresponding to the display region and the non-display region, and then the diffusible film 352 covers the openings for position control 353 and the diffusion barrier film 351. Herein, the diffusion barrier film 351 is formed of silicon oxide or equivalents thereof but not limited thereto. Additionally, the diffusible film 352 is formed from silicon nitride or equivalents thereof but not limited thereto.

Meanwhile, at least one opening for position control 353 is formed on the diffusion barrier film 351 in the non-display region 212 and the display region 211, respectively. The opening for position control 353 in the non-display region 212 is to form the alignment mark 240, and the opening for position control 353 in the display region 211 is to form the semiconductor layer 230, i.e., transistor. Further, it is desirable that the opening for position control 353 in the non-display region 212 has an area of about 100-900 $\mu m^2$. If the area of the opening is below 100 $\mu m^2$, crystallization may not sufficiently occur as a catalyst metal may not reach the amorphous silicon layer 340, and an insufficient alignment mark 240 may be formed. In addition, if the area of the opening is above 900 $\mu m^2$, too much catalyst metal may reach the amorphous silicon layer 340 such that the crystallization region may extend to be much larger than the opening for position control 353 resulting in a non-useful alignment mark 240. For example, when the alignment mark 240 is rectangular, experimentally and theoretically, it is desirable that size of the opening 353 of the diffusion barrier film 351 to form the alignment mark is about 400 $\mu m^2$.

In addition, the alignment mark 240 can have other shapes than rectangular. Whatever shapes the alignment mark 240 has, it is desirable that the width of the alignment mark 240 is about 20 μm or less. If the width of the alignment mark 240 is above 20 μm, the shape of the crystallization region to form the alignment mark 240 will be irregular, and accordingly, the resultant alignment mark 240 will not aid in the alignment of the layers. The alignment mark 240 can have a width in the range of 1-20 μm, provided that it is possible to observe the alignment mark 240 with a microscope. Further, the opening for position control 353 formed in the display region 211 can be designed depending on the size of the semiconductor layer 230, i.e., the size of the transistor.

Figure 6E:
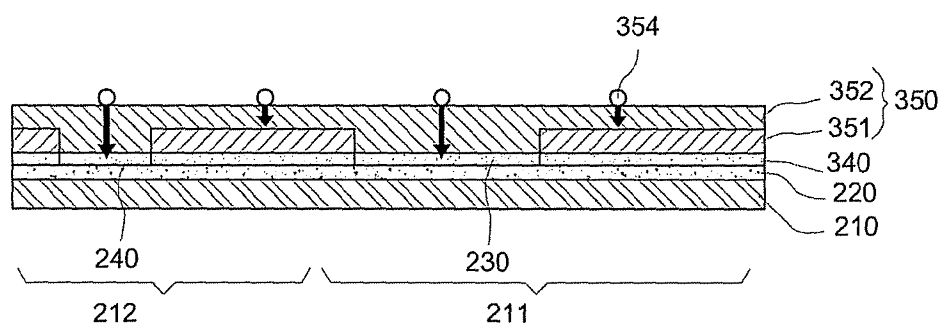

Referring to FIGS. 5 and 6*e*, in the operation (S5), the alignment mark 240 is formed of polycrystalline silicon in the non-display region 212 of the substrate 210 and the semiconductor layer 230 is formed of the polycrystalline silicon in the display region 211 of the substrate. Additional processes may be implemented to form an integral semiconductor layer 230, but the polycrystalline silicon formed in the display region 211 is referred to as the semiconductor layer 230 for convenience.

When catalyst metal 354 is located on the capping layer 350, i.e., on the diffusible film 352, and then the layers are heated to a predetermined temperature, the catalyst metal 354 diffuses through the capping layer 350, forms crystallization seeds at the interface between the capping layer 350 and the amorphous silicon layer 340, and forms polycrystalline silicon grain having a large size. The catalyst metal 354 located on the capping layer 350 may have a volumetric concentration of the range of $1.0\times10^{18}$-$1.0\times10^{22}$ atoms/cm$^3$. If the volumetric concentration of the catalyst metal 354 is below $1.0\times10^{18}$ atoms/cm$^3$, the catalyst metal 354 would be insufficient to perform adequate crystallization by the SGS crystallization process. If the volumetric concentration of the catalyst metal 354 is above $1.0\times10^{22}$ atoms/cm$^3$, excess catalyst metal 354 can remain in the alignment mark, semiconductor layer, and buffer layer so that increased leakage of current may occur. The catalyst metal 354 may be any of Ni, Pd, Ti, Ag, Au, Al, Sn, Sb, Cu, Co, Mo, Tr, Ru, Rh, Cd, and Pt, or a combination thereof, but not limited thereto.

In addition, it is desirable that the heat treating temperature is in the range of 400-700° C. If the temperature is below 400° C., insufficient crystallization by the catalyst metal 354 may occur. If the temperature is above 700° C., the substrate 210 may melt.

Figure 6F:
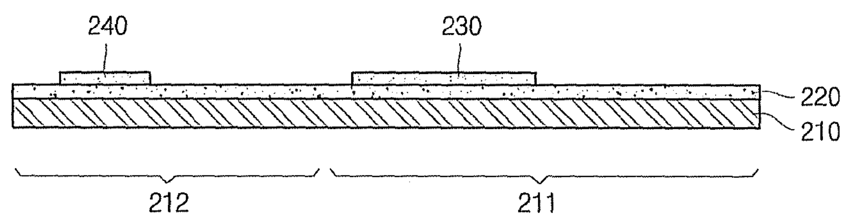

Referring to FIGS. 5 and 6*f*, in the operation (S6), the capping layer 350 including the diffusion barrier film 351 and the diffusible film 352 is etched out from the amorphous silicon and polycrystalline silicon. Further, a patterning is carried out. In other words, all of the amorphous silicon or polycrystalline silicon except for a portion to be used as the alignment mark 240 in the non-display region 212 and a portion to be used as the semiconductor layer 230 is etched out. By the etching process, polycrystalline silicon remains as the alignment mark 240. Further, the alignment mark 240 including the polycrystalline silicon extends above the buffer layer 220 to a same level as the semiconductor layer 230.

Figure 6G:
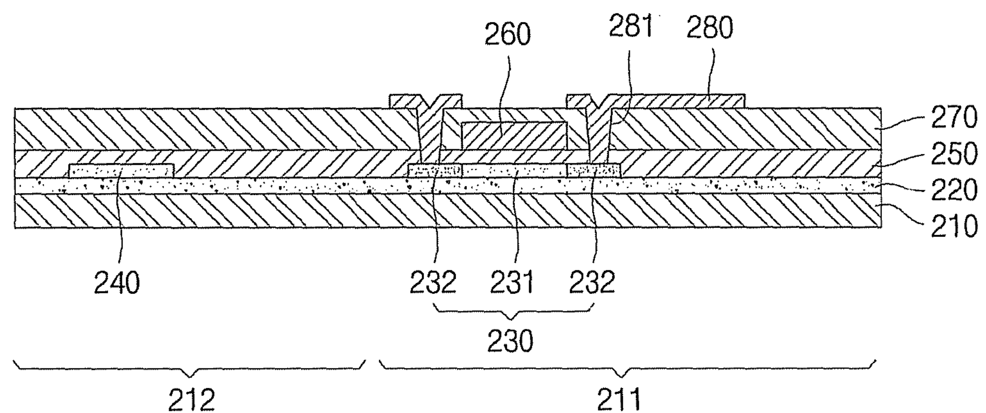

Referring to FIGS. 5 and 6*g*, in the operation (S7), the transistor is formed on the buffer layer 220 in the display region 211. More specifically, the gate insulating layer 250 having a constant thickness is formed on or to cover the alignment mark 240 and the semiconductor layer 230 on the buffer layer 220. Then, the gate electrode 260 is formed on the gate insulating layer 250 corresponding to a portion of the semiconductor layer 230 to be used as the channel region 231, and then a patterning process is carried out. Then, p-type impurities and n-type impurities are injected into the semiconductor layers 230 located at both sides of the gate electrode 260, and an activation process is carried out so that the source/drain regions 232 are formed. Subsequently, after forming the interlayer insulating layer 270, a conductive contact 281 is formed, and finally the source/drain electrode 280 is formed and patterned to be connected to the source/drain regions 232 of the semiconductor layer 230. Herein, the gate electrode 260 and the source/drain electrode 280 can be formed at optimal locations by using the alignment mark 240 as a reference.

Figure 6H:
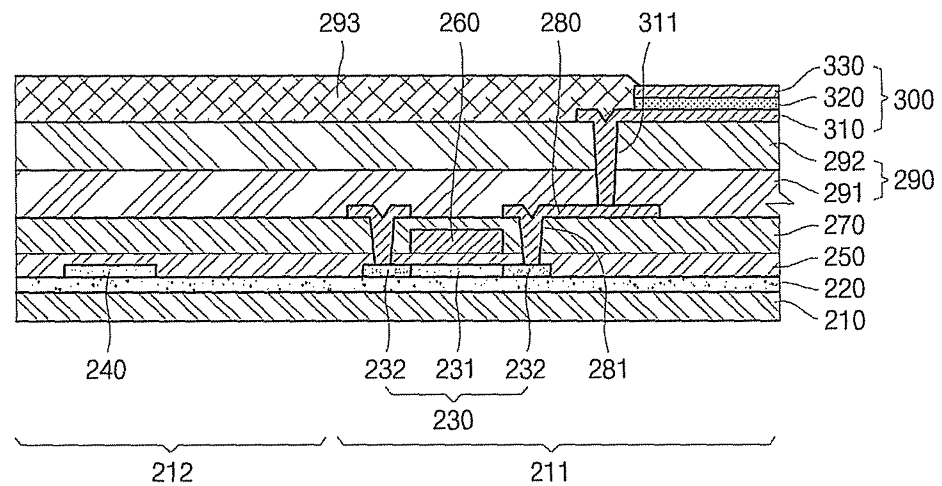

Then, the insulating layer 290 is formed on the source/drain electrode 280 and interlayer insulating layer 270, as shown in FIG. 6*h*. As described above, the insulating layer 290 may comprise the protective film 291 and the planarization film 292. The protective film 291 can be formed by depositing or coating typical inorganic film or equivalents thereof. The planarization film 292 flattens the entire surface of the element and can be formed by depositing or coating any one of BCB (benzocyclobutene), acryl, and equivalents thereof.

The interlayer insulating layer 270 and the insulating layer 290, comprising the protective film 291 and the planarization film 292, can also be formed on the non-display region 212 corresponding to the alignment mark 240. Further, the pixel definition film 293 can be additionally formed on the non-display region 212 corresponding to the alignment mark 240. Typically, the pixel definition film 293 is formed by depositing or coating polyimide or equivalents thereof. After the coating or depositing process, typical processes of applying a photoresist, exposing, developing, etching, and striping of the photoresist are carried out to expose the organic light emitting element 300.

Finally, referring still to FIGS. 5 and 6*h*, in the operation (S8), the anode 310, the organic light emitting film 320, and the cathode 330 are sequentially formed on the insulating layer 290. The anode 310 can be formed by depositing any one selected from the group consisting of ITO, ITO/Ag, ITO/Ag/IZO, and equivalents thereof, but it is not limited thereto. As an example, the anode 310 can be formed by an RF sputtering method, a DC sputtering method, an ion beam sputtering method, or a vacuum vapor deposition method. Thereafter, typical processes of applying a photoresist, exposing, developing, etching, and striping of the photoresist are carried out to form the anode 310 of a desired surface area at a desired location. The anode 310 is electrically coupled to the source/drain electrode 280 through the conductive contact 311, which passes through the insulating layer 290. Herein, the ITO is a transparent, electrically conductive film which has a uniform work function and thus has a lower hole injection barrier to the organic light emitting film 320. The Ag reflects light transmitted from the organic light emitting light emitting film 320 to the top surface in the top-emission type. The organic light emitting film 320 may include a hole injecting layer (HIL) to improve the efficiency of hole injection, a hole transport layer (HTL) to control the velocity of holes, an emitting layer (EML) to emit light when the electron and the hole are combined to form an exciton, an electron transport layer (ETL) to control the velocity of electrons, and an electron injecting layer (EIL) to improve the efficiency of electron injection, but the organic light emitting film 320 is not limited thereto. For example, the organic light emitting film 320 may be formed by a wet coating method, such as spin coating, dip coating, spraying, screen printing, ink jetting, etc., or by a dry coating method, such as sputtering, vacuum vapor deposition, etc. The cathode 330 is formed on the electron injection layer of the organic light emitting film 320. The cathode 330 can be formed from any one of Al, MgAg alloy, MgCa alloy, and equivalents thereof but not limited thereto. As an example, the cathode 330 can be formed by an RF sputtering method, a DC sputtering method, an ion beam sputtering method, or a vacuum vapor deposition method. Thereafter, processes of applying a photoresist, exposing, developing, etching, and striping of the photoresist are carried out to form the cathode 330 of a desired surface area at a desired location. In addition, if the top-emission type is adopted in accordance with aspects of the present invention and the cathode 330 is formed of Al, the thickness of the Al should be very thin. But, this will produce disadvantages of increasing resistivity and thus heightening the electron injection barrier. Accordingly, any one of the MgAg alloy, MgCa alloy and equivalents thereof that has a lower electron injection barrier than Al can be used to form the cathode 330. The cathode 330 can be formed from ITO or IZO. In this case, since the MgAg alloy and the MgCa alloy are sensitive to environmental factors and can be oxidized, an insulating layer may be formed thereon.

In addition, although the above description adopts a top-emission type organic light emitting display that emits light in upper direction, but the organic light emitting display is not limited thereto. Aspects of the present invention can also be applied in the bottom-emission type organic light emitting display that emits light in lower direction, or top and bottom emission type organic light emitting display that emits light in upper and lower directions.

Figure 7:
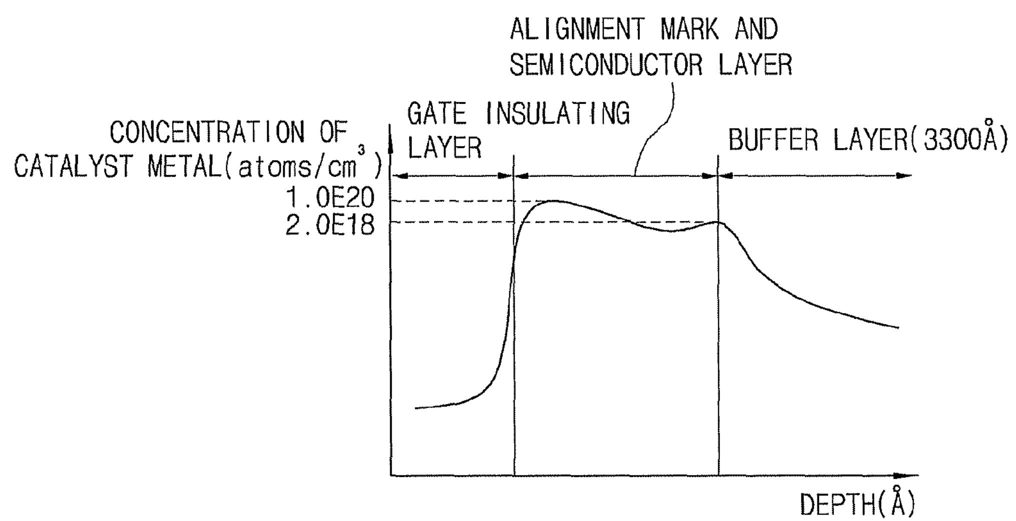
FIG. 7 is a graph illustrating catalyst metal concentration in a gate insulating layer, an alignment mark and semiconductor layer, and a buffer layer, respectively, of an organic light emitting display according to aspects of the present invention.

FIG. 7 is a graph illustrating a profile of catalyst metal concentration in the gate insulating layer, the alignment mark and the semiconductor layer, and the buffer layer, respectively, of the organic light emitting display according to aspects of the present invention. As described above, as the polycrystalline silicon in the organic light emitting display is formed by an SGS crystallization process that uses a catalyst metal, the catalyst metal remains at a certain concentration in the semiconductor layer, alignment mark, and buffer layer, respectively. It is desirable that the remaining catalyst metal in the semiconductor layer and the alignment mark has a concentration of $1.0\times10^{16}$-$1.0\times10^{20}$ atoms/cm$^3$.

If the volumetric concentration of the catalyst metal is above $1.0\times10^{22}$ atoms/cm$^3$, a leakage current may occur in, for example, the semiconductor. In addition, as shown in FIG. 7, as depth increases (or closer to the substrate) the concentration of the catalyst metal in the alignment mark and the semiconductor layer decreases. The amount of the catalyst metal is, however, increased at the interfaces between the alignment mark and the buffer layer or between the semiconductor layer and the buffer layer and then substantially decreased in a direction away from the alignment mark and the semiconductor layer. In addition, the catalyst metal also remains in the buffer layer. It is desirable that the volumetric concentration of the catalyst metal in the buffer layer is controlled to be below about $2.0\times10^{18}$ atoms/cm$^3$ because if the volumetric concentration is above $2.0\times10^{18}$ atoms/cm$^3$, leakage current can flow at a level greater than a threshold level. The volumetric concentration of the catalyst metal in the buffer layer decreases closer to the substrate or as depth increases. However, the reduced concentration is difficult to quantitatively measure due to limitations of the measuring device.

The alignment mark formed on the non-display region of the substrate is formed of the same material as the transistor formed on the display region, e.g., the polycrystalline silicon formed by the SGS crystallization, thereby allowing a separate process of forming the alignment mark to be omitted. Further, the separate mask for making the alignment mark, materials for the alignment mark, and the photolithography process are abbreviated, thereby improving production yield.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display, comprising:

a substrate having a display region comprising a plurality of pixel regions and a non-display region outside a boundary of the display region, each of the pixel regions comprising a thin film transistor and an organic light emitting element, the thin film transistor and the organic light emitting element being electrically coupled to each other in the display region of the substrate; and at least one alignment mark formed in the non-display region of the substrate by a super grained silicon (SGS) crystallization process, the at least one alignment mark comprising polycrystalline silicon and having no grain boundaries, wherein:

the pixel regions are disposed with reference to the at least one alignment mark;

a catalyst metal used in the SGS crystallization process remains in the at least one alignment mark;

no alignment mark is formed within the boundary of the display region;

the thin film transistor comprises a semiconductor layer comprising source/drain regions;

the at least one alignment mark is disposed on a same plane as the thin film transistor and has the same thickness as the entire semiconductor layer; and a width of the alignment mark is greater than a width of the source/drain regions.

2. The organic light emitting display of claim 1, wherein the semiconductor layer is formed of polycrystalline silicon formed by the SGS crystallization process.

3. The organic light emitting display of claim 2, wherein the semiconductor layer is patterned from the polycrystalline silicon so as to have no grain boundary or one grain boundary.

4. The organic light emitting display of claim 1, wherein the alignment mark has a shape selected from the group consisting of a triangle, a rectangle, a rhombus, a pentagon, a cross, and a “T” shape, or combinations thereof.

5. The organic light emitting display of claim 1, wherein the alignment mark has a cross-sectional area in the range of 100-900 $\mu m^2$.

6. The organic light emitting display of claim 1, wherein the alignment mark has a width in the range of 1-20 μm.

7. The organic light emitting display of claim 1, wherein the catalyst metal remaining in the alignment mark has a concentration in the range of $1.0\times10^{16}$-$1.0\times10^{20}$ atoms/$cm^3$.

8. The organic light emitting display of claim 1, wherein the substrate is made of any one of glass, plastic, stainless steel, and nano-composite materials.

9. The organic light emitting display of claim 1, wherein the non-display region is further provided with at least one of a data driver to supply a data signal to the display region, a scan driver to supply a scan signal to the display region, and a light emitting control driver to supply a light emitting control signal to the display region.

10. An organic light emitting display, comprising:

a substrate having a display region comprising a plurality of pixels and a non-display region outside a boundary of the display region;

a buffer layer formed on the display region and the non-display region;

a semiconductor layer comprising source/drain regions formed on the buffer layer in the display region by a super grained silicon (SGS) crystallization process;

an alignment mark formed on the buffer layer in the non-display region by the SGS crystallization process, the alignment mark comprising polycrystalline silicon and having no grain boundaries;

a gate insulating layer formed on the semiconductor layer and the alignment mark;

a gate electrode formed with reference to the alignment mark on the gate insulating layer above the semiconductor layer;

an interlayer insulating layer formed on the gate electrode;

a source/drain electrode formed on the interlayer insulating layer and electrically coupled to the semiconductor layer;

an insulating layer formed on the source/drain electrode; and an organic light emitting element formed on the insulating layer and electrically coupled to the source/drain electrode, wherein:

a catalyst metal used in the SGS crystallization process remains in the alignment mark;

no alignment mark is formed within the boundary of the display region;

the at least one alignment mark is disposed on a same plane as the semiconductor layer and has the same thickness as the entire semiconductor layer; and a width of the alignment mark is greater than a width of the source/drain regions.

11. The organic light emitting display of claim 10, wherein the gate insulating layer is formed with reference to the alignment mark.

12. The organic light emitting display of claim 10, wherein the interlayer insulating layer is formed with reference to the alignment mark.

13. The organic light emitting display of claim 10, wherein the alignment mark has a thickness in the range of 100-1000 Å.

14. The organic light emitting display of claim 10, wherein the alignment mark has a shape selected from the group consisting of a triangle, a rectangle, a rhombus, a pentagon, a cross, and a “T” shape, or combinations thereof.

15. The organic light emitting display of claim 10, wherein the alignment mark has a cross-sectional area in the range of 100-900 $\mu m^2$.

16. The organic light emitting display of claim 10, wherein the substrate is made from any one of glass, plastic, stainless steel, and nano-composite materials.

17. The organic light emitting display of claim 10, wherein the insulating layer comprises a protective film and a planarization film and is formed with reference to the alignment mark.

18. The organic light emitting display of claim 10, wherein the alignment mark has a width in the range of 1-20 μm.

19. The organic light emitting display of claim 10, wherein the catalyst metal remaining in the alignment mark has a concentration in the range of $1.0\times10^{16}$-$1.0\times10^{20}$ atoms/$cm^3$.

20. The organic light emitting display of claim 10, wherein the semiconductor layer and the organic light emitting element are disposed with reference to the alignment mark.

21. The organic light emitting display of claim 10, wherein the interlayer insulating layer is formed on the gate insulating layer.

22. The organic light emitting display of claim 10, wherein the insulating layer is formed on the interlayer insulating layer.

23. The organic light emitting display of claim 10, wherein the source/drain electrode is formed with reference to the alignment mark.

24. The organic light emitting display of claim 10, wherein the organic light emitting element is formed with reference to the alignment mark.

25. An organic light emitting display, comprising:

a substrate having a display region comprising a plurality of pixels and a non-display region outside a boundary of the display region;

a buffer layer formed on the display region and the non-display region;

a semiconductor layer comprising source/drain regions formed on the buffer layer in the display region;

alignment marks formed on the buffer layer in the non-display region, the alignment marks being formed near corners of the substrate, being polycrystalline silicon, and having no grain boundaries;

a gate insulating layer formed on the semiconductor layer and the alignment marks;

a gate electrode formed on the gate insulating layer above the semiconductor layer and formed with reference to at least one of the alignment marks;

an interlayer insulating layer formed on the gate electrode;

a source/drain electrode formed on the interlayer insulating layer and electrically coupled to the semiconductor layer;

an insulating layer formed on the source/drain electrode; and an organic light emitting element formed on the insulating layer and electrically coupled to the source/drain electrode, wherein:

a catalyst metal used in the SGS crystallization process remains in the alignment marks;

no alignment mark is formed within the boundary of the display region;

the at least one alignment mark is disposed on a same plane as the semiconductor layer and has the same thickness as the entire semiconductor layer; and a width of the alignment mark is greater than a width of the source/drain regions.

26. The organic light emitting display of claim 25, further comprising alignment marks formed in the non-display region between the alignment marks arranged near the corners of the substrate.

27. An organic light emitting display, comprising:

a substrate having a display region comprising a plurality of pixels and a non-display region outside a boundary of the display region;

a buffer layer formed on the display region and the non-display region;

a semiconductor layer comprising source/drain regions formed on the buffer layer in the display region by a super grained silicon (SGS) crystallization process;

an alignment mark formed on the buffer layer in the non-display region by the SGS crystallization process, the alignment mark comprising polycrystalline silicon and having no grain boundaries;

a gate insulating layer formed on the semiconductor layer and formed with reference to the alignment mark;

a gate electrode formed on the gate insulating layer above the semiconductor layer and formed with reference to the alignment mark;

an interlayer insulating layer formed on the gate electrode and formed with reference to the alignment mark;

a source/drain electrode formed on the interlayer insulating layer and electrically coupled to the semiconductor layer and formed with reference to the alignment mark;

an insulating layer formed on the source/drain electrode and formed with reference to the alignment mark; and an organic light emitting element formed on the insulating layer and electrically coupled to the source/drain electrode and formed with reference to the alignment mark, wherein:

a catalyst metal used in the SGS crystallization process remains in the alignment mark;

no alignment mark is formed within the boundary of the display region;

the at least one alignment mark is disposed on a same plane as the semiconductor layer and has the same thickness as the entire semiconductor layer; and a width of the alignment mark is greater than a width of the source/drain regions.

* * * * *